United States Patent [19]
Watson et al.

[11] Patent Number: 5,168,926
[45] Date of Patent: Dec. 8, 1992

[54] HEAT SINK DESIGN INTEGRATING INTERFACE MATERIAL

[75] Inventors: Jeff Watson, Beaverton; Charles Ruff, Hillsboro, both of Oreg.

[73] Assignee: Intel Corporation, Santa Clara, Calif.

[21] Appl. No.: 766,425

[22] Filed: Sep. 25, 1991

[51] Int. Cl.$^5$ .......................... F28F 7/00; H01L 23/40; H02B 1/56
[52] U.S. Cl. ..................................... 165/185; 165/80.3; 361/386; 361/387; 257/706
[58] Field of Search ............... 361/387, 388, 389, 386; 165/80.2, 80.3, 185; 357/81

[56] References Cited

U.S. PATENT DOCUMENTS

| | | | |
|---|---|---|---|
| 4,092,697 | 5/1978 | Spaight | 361/387 |
| 4,360,141 | 11/1982 | Kensrue | 165/170 |
| 4,415,025 | 11/1983 | Horvath | 361/386 |
| 4,603,374 | 7/1986 | Wasielewski | 361/388 |
| 4,605,058 | 8/1986 | Wilens | 165/185 |
| 4,771,365 | 9/1988 | Cichocki et al. | 361/387 |
| 4,833,567 | 5/1989 | Saaski et al. | 361/385 |
| 4,888,637 | 12/1989 | Sway-Tin et al. | 357/81 |
| 5,028,984 | 7/1991 | Ameen et al. | 357/81 |

FOREIGN PATENT DOCUMENTS

| | | | |
|---|---|---|---|
| 7155 | 1/1985 | Japan | 357/81 |
| 55966 | 3/1988 | Japan | 357/81 |
| 31443 | 2/1989 | Japan | 357/81 |
| 59841 | 3/1989 | Japan | 357/81 |
| 49457 | 2/1990 | Japan | 357/81 |

OTHER PUBLICATIONS

Cunavelis et al., "External Module Heat Sink Fastened To Board", IBM Technical Disclosure Bulletin, vol. 14, No. 1, Jun. 1971, p. 182.
Almquist et al., "Spring-Clip Mounted Extruded Aluminum Heat Sink", IBM Technical Disclosure Bulletin, vol. 23, No. 12, May 1981, p. 5303.
"Low Profile Heat Sink", IBM Technical Disclosure Bulletin, vol. 28, No. 12, May 1986, pp. 5172-5173.
"Stock-On Heat Sink", Research Disclosure, No. 270, Oct., 1986, 27014.

*Primary Examiner*—John Rivell
*Assistant Examiner*—L. R. Leo
*Attorney, Agent, or Firm*—Blakely, Sokoloff, Taylor & Zafman

[57] ABSTRACT

A method and assembly for a heat sink that is attached to a chip carrier. The heat sink has a plurality of fins extending from the first surface of a plate and a pair of rails extending from a second opposite surface of the plate. The rails are constructed to contain and restrain the heat sink on the chip carrier. The heat sink also has a recess and a pair of support surfaces between the rails. To attach the chip carrier to the heat sink, a thermally conductive adhesive is applied into the center of the recess. The chip carrier is then placed on the support surfaces between the rails. Mounting the carrier on the support surface pushes the adhesive throughout the recess. The adhesive cures at room temperature, wherein the heat sink is bonded to the chip carrier.

6 Claims, 1 Drawing Sheet

HEAT SINK DESIGN INTEGRATING INTERFACE MATERIAL

BACKGROUND OF THE INVENTION

1. Field of the Invention

The present invention relates to a method and assembly for a heat sink that is attached to an electrical device.

2. Description of Related Art

Heat sinks are commonly used to remove heat from electrical devices mounted to electronic circuit boards. Most heat sinks have a plurality of fins that provide a large surface area, so that the heat can be efficiently removed by natural or forced convection. The heat is typically generated by integrated circuits that are housed within chip carriers mounted to printed circuit boards. A heat sink is typically mounted directly to the chip carrier to minimize the conductive path between the integrated circuit and the sink.

The heat sink is attached by mounting the chip carrier onto a flat surface of the heat sink. A sheet of thermally conductive adhesive film is placed between the flat surface of the heat sink and the chip carrier. The adhesive film is then heated while the chip carrier and heat sink are pressed together, wherein the adhesive bonds the two pieces together. A uniform pressure is applied to the members by a spring loaded fixture, to ensure a uniform bonding layer and to prevent shifting during cure. Another conventional method of attachment utilizes mechanical fasteners and a thermally conductive grease. It would be desirable to have a heat sink and a method of attaching the heat sink to an electrical device, without having to use an external fixture or pressure.

SUMMARY OF THE INVENTION

The present invention is a method and assembly for a heat sink that is attached to a chip carrier. The heat sink has a plurality of fins extending from the first surface of a plate and a pair of rails extending from a second opposite surface of the plate. The rails are constructed to contain and restrain the heat sink on the chip carrier. The heat sink also has a recess and a pair of support surfaces between the rails, to control the adhesive bond line thickness without fixturing or pressure.

To attach the chip carrier to the heat sink, a thermally conductive adhesive is applied into the center of the recess. The chip carrier is then placed on the support surfaces between the rails. The rails prevent the carrier from shifting while the adhesive is curing. Mounting the carrier on the support surface pushes the adhesive throughout the recess. The adhesive is allowed to cure, wherein the heat sink is bonded to the chip carrier. The adhesive is of the type that allows the heat sink to be connected after the chip carrier is soldered to a circuit board. The recess provides a means for accurately controlling the bond line thickness of the adhesive. The resulting assembly has a uniform bonding area with a predictable thermally conductive path and a known bond strength.

Therefore, it is an object of this invention to provide a method of attaching a chip carrier to a heat sink that creates a uniform bond line thickness of adhesive, thereby creating a predictable thermally conductive path and a known bond strength for all assemblies.

It is also an object of this invention to provide a heat sink that allows the heat sink to be attached to a chip carrier without movement during the curing process.

It is also an object of this invention to provide a method of attaching a chip carrier to a heat sink that utilizes a thermally conductive adhesive.

It is also an object of this invention to provide a method of attaching a heat sink to a chip carrier after the carrier is soldered to a circuit board.

BRIEF DESCRIPTION OF THE DRAWINGS

The objects and advantages of the present invention will become more readily apparent to those skilled in the art after reviewing the following detailed description and accompanying drawings, wherein.

DETAILED DESCRIPTION OF THE DRAWINGS

Figure 1:
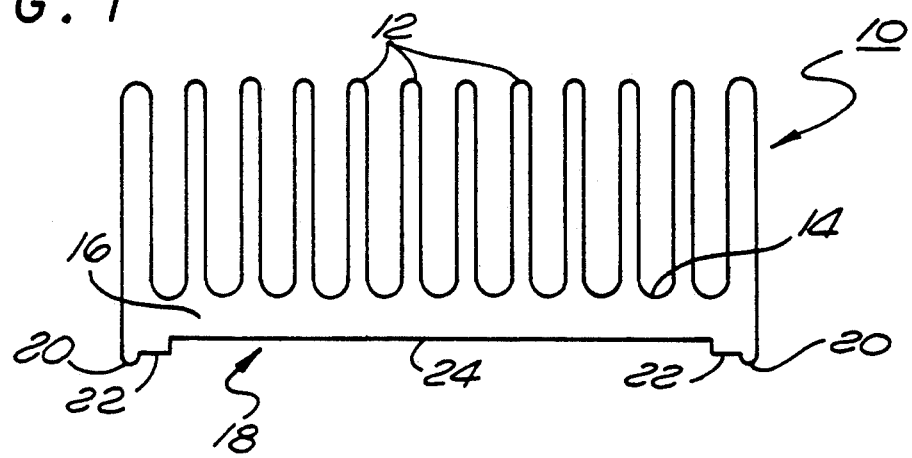
FIG. 1 is a side view of a heat sink of the present invention.
Figure 2:
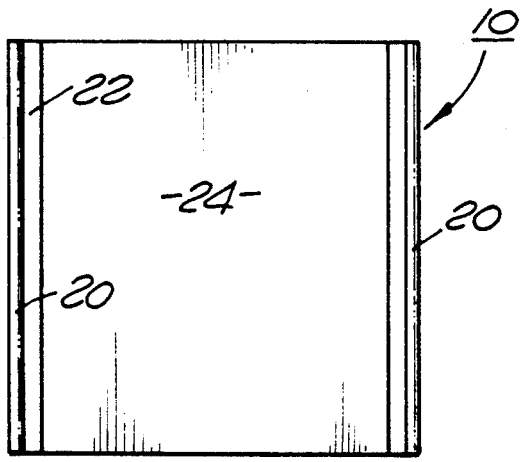
FIG. 2 is a top view of FIG. 2.

Referring to the drawings more particularly by reference numbers, FIGS. 1 and 2 show a heat sink 10 of the present invention. The heat sink 10 is typically constructed from a light thermally conductive material. The heat sink 10 can have a plurality of fins 12 extending from the first surface 14 of a plate 16. The fins 12 are located so that heat can be removed from the heat sink 10. The fins 12 provide a large surface area, so that the heat sink 10 has a large rate of heat transfer.

Figure 3:
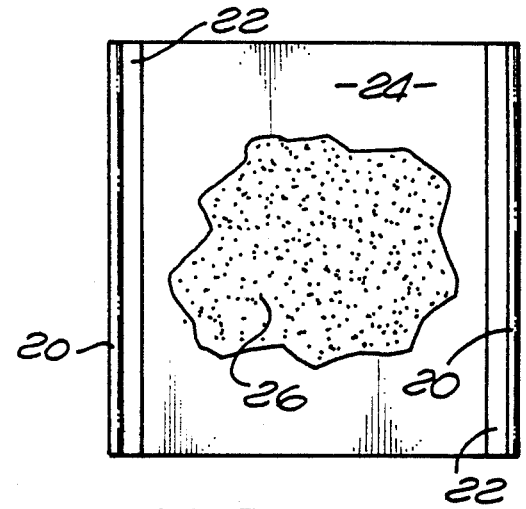
FIG. 3 is a top view of the heat sink of FIG. 1, showing an adhesive applied to the heat sink.
Figure 4:
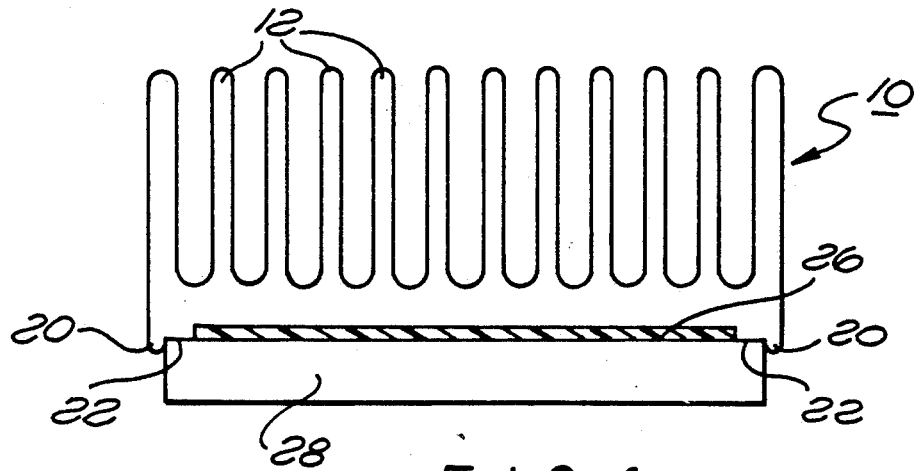
FIG. 4 is a side view showing a chip carrier attached to the heat sink.

Extending from a second surface 18 of the plate 16 are a pair of rails 20, that run along the length of the heat sink, as shown in FIG. 2. Between the rails 20 are a pair of support surfaces 22 and a recess 24. As shown in FIGS. 3 and 4, an adhesive 26 can be dispensed into the recess 24 and a chip carrier 28 or other electrical device can be placed onto the heat sink 10. The chip carrier 28 typically contains an integrated chip which produces heat. The chip carrier 28 is placed between the rails 20 which prevent rotation and lateral, while the carrier 28 is being bonded to the heat sink 10. Although two rails 20 extending down the sides of the heat sink 10 are shown, it is to be understood that the rails 20 may extend around the periphery of the heat sink 10, so that the chip carrier 28 can be laterally restrained in two axis. The pair of rails 20 shown allow the heat sink 10 to be extruded and cut, resulting in a product 10 that can be economically mass produced.

The chip carrier 28 is pushed down between the rails 20 until the bottom of the carrier seats on the support surfaces 22. The adhesive 26 can be initially applied to cover the recess 24, or the adhesive 26 can be dispensed as a mound in the center of the heat sink 10, as shown in FIG. 3. The adhesive 26 is then squeezed and flows throughout the recess 24, when the carrier 28 is pushed onto the support surfaces 22. The volume of adhesive 26 supplied can be equal to the volume of the recess 24, so that there are no air gaps between the chip carrier 28 and the heat sink 10 throughout the recess 24. The adhesive 26 should also cure at ambient temperatures and without pressure. The adhesive 26 is preferably a thermally conductive epoxy that is deformable in the uncured state. No additional equipment, such as an oven or clamp is required to assemble the present invention.

The carrier 28 is left in place until the adhesive 26 has cured, wherein the heat sink 10 is bonded to the carrier 28 to create a carrier subassembly 30. The room cured adhesive allows the heat sink 10 to be attached to a chip carrier 28, after the carrier 28 is soldered to a circuit board. The recess 24 provides a means to create a bonding interface between a chip carrier 28 and heat sink 10, that is constant and uniform for every subassembly 30. The recess 24 should be deep enough so that the adhesive 26 can flow throughout the recess area, but shallow enough to create a short thermal path between the chip carrier 28 and the heat sink 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic assembly, comprising:
   a housing block having a plate with a plurality of fins extending from a first surface of said plate and a pair of rails extending from an opposite second surface of said plate, said plate further having a pair of support surfaces essentially perpendicular to said rails and a recess between said support surfaces;
   an electrical device mounted onto said support surfaces between said rails of said housing block; and,
   an adhesive that completely fills said recess and does not extend past said support surface, wherein said recess controls said adhesive thickness.

2. The electronic assembly as recited in claim 1, wherein said adhesive is a thermally conductive epoxy.

3. The electronic assembly as recited in claim 2, wherein said electrical device is a chip carrier that contains an integrated circuit.

4. A method for controlling the thickness of an adhesive that couples an electronic device to a heat sink, comprising the steps of:
   providing an electrical device;
   providing a housing block having a plate with a plurality of fins extending from a first surface of said plate and a pair of rails extending from an opposite second surface of said plate, said plate further having a pair of support surfaces essentially perpendicular to said rails and a recess between said support surfaces, said recess having a predetermined volume;
   applying an adhesive onto said recess of said housing block, said applied adhesive having a volume that approximates said volume of said recess;
   placing said electrical device onto said support surfaces of said housing block, such that said adhesive completely fills said recess; and,
   curing said adhesive such that said electrical device is attached to said housing block.

5. The method as recited in claim 4 wherein said adhesive is a thermally conductive epoxy that cures at ambient temperature and pressure.

6. The method as recited in claim 5, wherein said electrical device is a chip carrier that contains an integrated circuit.

* * * * *